US006677760B1

(12) United States Patent
Koyama

(10) Patent No.: US 6,677,760 B1
(45) Date of Patent: Jan. 13, 2004

(54) METHOD OF AND APPARATUS FOR ANALYZING FAILURE

(75) Inventor: Tohru Koyama, Tokyo (JP)

(73) Assignee: Renesas Technology Corp., Tokyo (JP)

(*) Notice: Subject to any disclaimer, the term of this patent is extended or adjusted under 35 U.S.C. 154(b) by 401 days.

(21) Appl. No.: 09/664,335

(22) Filed: Sep. 18, 2000

(30) Foreign Application Priority Data

Apr. 3, 2000 (JP) .................................... P2000-100618

(51) Int. Cl.[7] ...................... G01R 31/00; G01R 31/308; H01L 31/20

(52) U.S. Cl. ....................... 324/501; 324/752; 324/523; 257/53

(58) Field of Search ................................ 324/501, 752, 324/753, 96, 76.36, 522, 523; 356/320, 237.1, 237.4, 237.5; 257/48, 431, 53, 54, 225; 250/227.23, 339.01

(56) References Cited

U.S. PATENT DOCUMENTS

| | | | | | |
|---|---|---|---|---|---|
| 4,968,932 | A | * | 11/1990 | Baba et al. | 324/767 |
| 5,422,498 | A | * | 6/1995 | Nikawa et al. | 257/48 |
| 5,708,371 | A | | 1/1998 | Koyama | |
| 5,760,892 | A | | 6/1998 | Koyama | |
| 5,952,837 | A | | 9/1999 | Koyama | |
| 6,066,956 | A | * | 5/2000 | Nikawa | 324/752 |
| 6,078,183 | A | * | 6/2000 | Cole, Jr. | 324/752 |
| 6,169,408 | B1 | * | 1/2001 | Kantor et al. | 324/752 |

FOREIGN PATENT DOCUMENTS

DE 196 48 659 A1 * 5/1998 ................. 324/501

OTHER PUBLICATIONS

Kiyoshi Nikawa, et al., "Detection and Characterization of Failures and Defects in LSI Chips by Optical Beam Induced Resistance Change (OBIRCH)," DRIP (Defect Recognition and Image Processing in Semiconductors) VII, Proc. Drip VII, Inst. Phys. Conf., Series No. 160, 1998, pp. 37–46.

Edward I. Cole Jr., et al., "Backside Localization of Open and Shorted IC Interconnections," 36$^{th}$ Annual International Reliability Physics Symposium, 1998, pp. 129–136.

Tohru Koyama, et al., "Detection of Defects in Metal Interconnects by the Nonbias–optical Beam Induced Current Technique," Journal of Applied Physics, vol. 86, No. 11, Dec. 1, 1999, pp. 5949–5956.

U.S. patent application Ser. No. 09/907,940, filed Jul. 19, 2001, pending.

U.S. patent application Ser. No. 09/907,940, filed Jul. 19, pending.

* cited by examiner

*Primary Examiner*—Anjan K. Deb
(74) *Attorney, Agent, or Firm*—Oblon, Spivak, McClelland, Maier & Neustadt, P.C.

(57) ABSTRACT

A method of and apparatus for analyzing a failure is provided. A laser beam generator (1) has a plurality of laser beam sources differing in wavelength from each other. First, the laser beam generator (1) generates a laser beam (B1) of about 1.1 μm in wavelength, and a failure analyzer (6) stores therein a resultant first current image. Next, the laser beam generator (1) generates a laser beam (B1) of about 1.3 μm in wavelength, and the failure analyzer (6) stores therein a resultant second current image. Next, the laser beam generator (1) generates a laser beam (B1) of not less than 2.0 μm in wavelength, and the failure analyzer (6) stores therein a resultant third current image. The failure analyzer (6) analyzes the cause and site of a failure in a sample (3) by reference to the first to third current images stored therein. The method can diagnose and localize the failure in a chip by reference to only the current images obtained by the laser beam irradiation.

24 Claims, 9 Drawing Sheets

F I G. 1 7 BACKGROUND ART
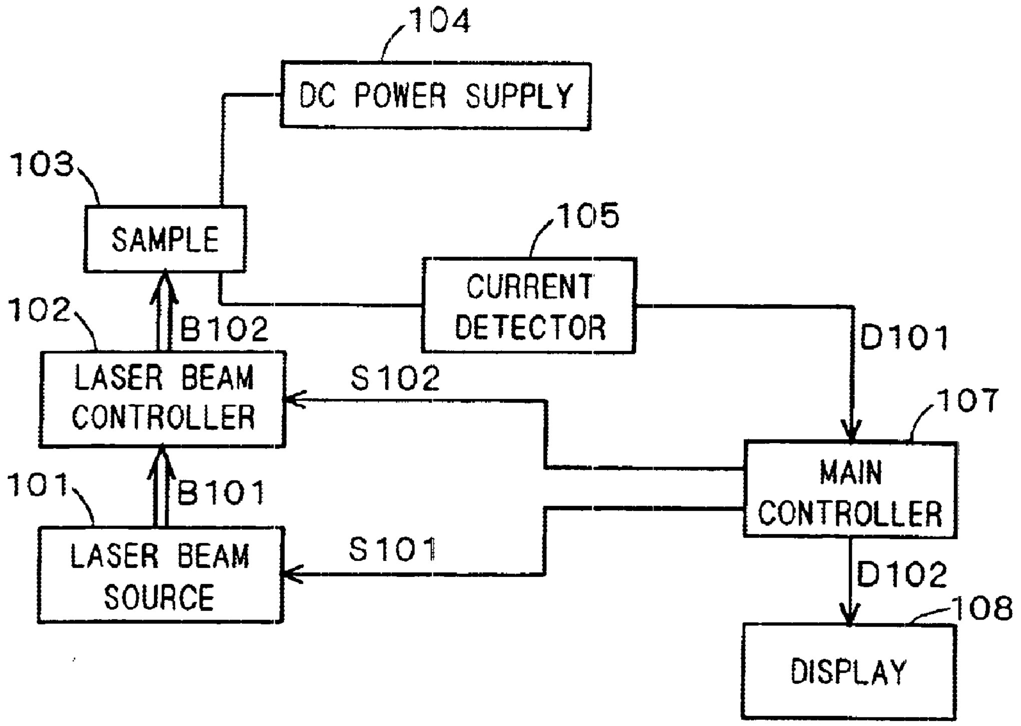

METHOD OF AND APPARATUS FOR ANALYZING FAILURE

BACKGROUND OF THE INVENTION

1. Field of the Invention

The present invention relates to a method of and apparatus for analyzing a failure in semiconductor devices such as large scale integrated (LSI) devices.

2. Description of the Background Art

In semiconductor devices such as LSI devices, as the miniaturization of elements and the degree of integration increase, the number of interconnection levels of a metal interconnection structure increases. In high-performance LSI devices, with the increasing number of electrode pads, a so-called flip-chip structure in which electrode pads are formed not only around a chip but also in the chip has been mainstream. Such trends toward the increase in the number of interconnection levels of the metal interconnection structure and toward the flip-chip structure of the LSI devices make it impossible to conventionally analyze failures by accessing the chip (or wafer) through its upper surface by the use of a charged particle beam, such as an electron beam and an ion beam, or visible light. It is hence essential to employ failure analysis techniques which access the chip through its bottom surface (backside or opposite main surface from the device). An effective one of the failure analysis techniques of the backside accessing type includes a laser-induced current analysis (Infrared-Optical Beam Induced Current (IR-OBIC) analysis) technique utilizing a near-infrared laser beam. An example of the OBIC analyses by accessing the chip through its backside is disclosed in, for example, Japanese Patent Application Laid-Open No. 5-136240 (1993).

Light having energy not greater than the band gap energy of silicon, i.e. light having a wavelength of not less than 1 μm can penetrate into a silicon substrate to some extent. The backside of the chip is irradiated with a near-infrared laser beam, and a change in current observed in synchronism with the scanning of the beam is converted into brightness to produce a current image. The IR-OBIC analysis obtains information about a failure-containing region in the chip, based on the current image.

The observed current is changed by photoexcitation and thermal excitation of electrons and holes which are caused by laser beam irradiation. Electron-hole pairs photoexcited near the pn junction in the silicon substrate are observed as photoinduced current to allow the manifestation of the pn junction, the detection of a junction leakage site, the detection of a gate leakage site, and the like. Selective photoexcitation of electrons or holes in metal interconnect lines allows the manifestation of a Schottky barrier. This permits the detection of in-process discrepancies, e.g. a faulty site at a contact between a metal interconnect line and the silicon substrate which results from the depletion of a dopant. On the other hand, the thermal excitation may be used to detect high-resistance sites such as voids and interface layers in the metal interconnect lines or contact holes. This utilizes the phenomenon that heat generated at a high-resistance site generates thermally-induced current and a resistance change, and a resultant change in observed current appears in the current image.

FIG. 17 is a block diagram of a background art apparatus for analyzing a failure in a semiconductor device. The background art apparatus, as shown in FIG. 17, comprises a laser beam source 101, a laser beam controller 102, a DC power supply 104, a current detector 105, a main controller 107, and a display 108. A laser beam source which generates a laser beam having a wavelength of about 1.1 μm or about 1.3 μm is commonly used as the laser beam source 101. When using the laser beam source 101 which generates the laser beam of about 1.1 μm in wavelength, the apparatus can analyze all of the above-mentioned failure modes (i.e., a pn junction defect, a Schottky junction defect, and a faulty site in the metal interconnect line and the like). When using the laser beam source 101 which generates the laser beam of about 1.3 μm in wavelength, the apparatus can analyze the Schottky junction defect and the faulty site in the metal interconnect line and the like among the above described three failure modes.

A conventional method of analyzing a failure by the use of the apparatus of FIG. 17 is described below. The laser beam source 101 generates a laser beam B101 based on a control signal S101 from the main controller 107. The laser beam controller 102 controls the path of the laser beam B101 based on a control signal S102 from the main controller 107, and scans a laser beam B102 across the backside of a sample 103. The current detector 105 detects current caused to flow in the sample 103 by the application of a predetermined voltage from the DC power supply 104 and the irradiation with the laser beam B102 from the laser beam controller 102, to input the detected current as data D101 to the main controller 107. Based on the data D101, the main controller 107 converts a change in current into brightness to produce a current image in the form of a two-dimensional image. The produced current image is inputted as data D102 to the display 108, and is then displayed on a screen of the display 108.

The background art apparatus and method can two-dimensionally determine a failure-containing region in a chip by reference to the produced current image. By reference to the current image only, however, it is difficult to specifically diagnose and localize a failure in the chip, that is, to determine where the failure occurs in the chip in three dimensions or whether the failure is the pn junction defect, the Schottky junction defect or the fault in the metal interconnect line.

SUMMARY OF THE INVENTION

A first aspect of the present invention is intended for a method of analyzing a failure. According to the present invention, the method comprises the steps of: (a) irradiating a sample with a laser beam; (b) detecting a current generated in the sample as a result of the irradiation with the laser beam; and (c) analyzing a failure in the sample, based on detection results obtained in the step (b) when the sample is irradiated with the laser beam at respective different wavelengths.

Preferably, according to a second aspect of the present invention, in the method of the first aspect, the sample is irradiated with laser beams of about 1.1 μm, about 1.3 μm, and not less than 2.0 μm in wavelength, respectively, in the step (c).

Preferably, according to a third aspect of the present invention, in the method of the first aspect, the step (a) comprises the steps of: (a-1) scanningly irradiating the sample with the laser beam, and (a-2) fixedly irradiating a specific site of the sample with the laser beam, one of the steps (a-1) and (a-2) being selectively executed. The step (c) comprises the steps of: (c-1) determining a failure-containing region in which some form of failure occurs, based on a detection result obtained in the step (b) when the step (a-1) is executed; and (c-2) analyzing the cause of the failure in the failure-containing region, based on detection results obtained in the step (b) when the wavelength of the laser beam is changed while the failure-containing region is fixedly irradiated with the laser beam in the step (a-2).

Preferably, according to a fourth aspect of the present invention, in the method of the third aspect, the current is detected in the step (b) at a plurality of timed instants after irradiation of the failure-containing region with the laser beam, the plurality of timed instants being respectively corresponding to time constants of the current, the time constants being different from each other in excitation source of carriers generated by the irradiation with the laser beam.

A fifth aspect of the present invention is intended for a method of analyzing a failure. According to the present invention, the method comprises the steps of: (a) irradiating a sample with a laser beam of a predetermined wavelength; (b) applying a voltage to the sample; (c) detecting a current generated in the sample as a result of the application of the voltage and the irradiation with the laser beam; and (d) analyzing a failure in the sample, based on a detection result obtained in the step (b) when the voltage is changed while the sample is irradiated with the laser beam.

Preferably, according to a sixth aspect of the present invention, in the method of the fifth aspect, the step (a) comprises the steps of: (a-1) scanningly irradiating the sample with the laser beam; and (a-2) fixedly irradiating a specific site of the sample with the laser beam, one of the steps (a-1) and (a-2) being selectively executed. The step (d) comprises the steps of: (d-1) determining a failure-containing region in which some form of failure occurs, based on a detection result obtained in the step (c) when the step (a-1) is executed; and (d-2) analyzing the cause of the failure in the failure-containing region, based on a detection result obtained in the step (c) when the voltage is changed while the failure-containing region is fixedly irradiated with the laser beam in the step (a-2).

Preferably, according to a seventh aspect of the present invention, in the method of the third or sixth aspect, the sample is irradiated with the laser beam which is intermittently intercepted in the step (a-2).

Preferably, according to an eighth aspect of the present invention, in the method of the sixth or seventh aspect, the current is detected in the step (c) at a plurality of timed instants after irradiation of the failure-containing region with the laser beam, the plurality of timed instants being respectively corresponding to time constants of the current, the time constants being different from each other in excitation source of carriers generated by the irradiation with the laser beam.

A ninth aspect of the present invention is intended for a method of analyzing a failure. According to the present invention, the method comprises the steps of: (a) irradiating a sample with a laser beam of a predetermined wavelength; (b) detecting a current generated in the sample as a result of the irradiation with the laser beam at a plurality of timed instants after the irradiation of the sample with the laser beam, the plurality of timed instants being respectively corresponding to time constants of the current, the time constants being different from each other in excitation source of carriers generated by the irradiation with the laser beam; and (c) analyzing a failure in the sample, based on detection results obtained in the step (b).

A tenth aspect of the present invention is intended for an apparatus for analyzing a failure. According to the present invention, the apparatus comprises: a laser beam generator for selectively generating a plurality of laser beams of respective different wavelengths; a current detector for detecting a current generated in a sample as a result of irradiation with the laser beam; and a failure analyzer for analyzing a failure in the sample, based on a relationship between detection results from the current detector and the wavelengths.

Preferably, according to an eleventh aspect of the present invention, in the apparatus of the tenth aspect, the laser beam generator comprises a plurality of laser beam sources for generating the plurality of laser beams, respectively.

Preferably, according to a twelfth aspect of the present invention, in the apparatus of the tenth aspect, the laser beam generator comprises: a laser beam source for generating a laser beam of a predetermined wavelength; and a wavelength converter for converting the predetermined wavelength of the laser beam generated by the laser beam source to generate the plurality of laser beams.

Preferably, according to a thirteenth aspect of the present invention, in the apparatus of any one of the tenth to twelfth aspects, the plurality of laser beams include laser beams of about 1.1 $\mu$m, about 1.3 $\mu$m, and not less than 2.0 $\mu$m in wavelength, respectively.

Preferably, according to a fourteenth aspect of the present invention, the apparatus of the tenth aspect further comprises a laser beam controller having a first function of scanningly irradiating the sample with the laser beam, and a second function of fixedly irradiating a specific site of the sample with the laser beam.

A fifteenth aspect of the present invention is intended for an apparatus for analyzing a failure. According to the present invention, the apparatus comprises: a laser beam generator for generating a laser beam of a predetermined wavelength; a voltage applier for applying a variable voltage to the sample; a current detector for detecting a current generated in the sample as a result of the application of the voltage and irradiation with the laser beam; and a failure analyzer for analyzing a failure in the sample, based on a relationship between a detection result from the current detector and the voltage.

Preferably, according to a sixteenth aspect of the present invention, the apparatus of the fifteenth aspect further comprises a laser beam controller having a first function of scanningly irradiating the sample with the laser beam, and a second function of fixedly irradiating a specific site of the sample with the laser beam.

Preferably, according to a seventeenth aspect of the present invention, in the apparatus of the fourteenth or sixteenth aspect, the specific site of the sample is a failure-containing region in which some form of failure occurs. The apparatus further comprises a laser beam interceptor for intermittently intercepting the laser beam when the laser beam controller fixedly irradiates the failure-containing region with the laser beam.

Preferably, according to an eighteenth aspect of the present invention, in the apparatus of any one of the fourteenth, sixteenth and seventeenth aspect, the current detector detects the current at a plurality of timed instants after irradiation of the failure-containing region with the laser beam, the plurality of timed instants being respectively corresponding to time constants of the current, the time constants being different from each other in excitation source of carriers generated by the irradiation with the laser beam.

In accordance with the first aspect of the present invention, the method uses the plurality of laser beams differing in wavelength from each other for failure analysis to achieve the analysis of the cause of the failure in the sample and the three-dimensional analysis of a failure site in the sample.

In accordance with the second aspect of the present invention, the method can analyze three types of failure, i.e. a pn junction defect, a Schottky junction defect, and a faulty site in a metal interconnect line, in a semiconductor device employing a silicon substrate.

In accordance with the third aspect of the present invention, the method can determine the failure-containing region by scanningly irradiating the sample with the laser beam, and thereafter analyze the cause of the failure in the failure-containing region by fixedly irradiating only the failure-containing region with the laser beam and converting the wavelength of the laser beam.

In accordance with the fourth aspect of the present invention, the method can analyze the presence or absence of the cause of the failure of the three types at the timed instants at which the occurrence of the failure significantly affects a variation in current value.

In accordance with the fifth aspect of the present invention, changing the voltage applied to the sample while irradiating the sample with the laser beam allows the analysis of the cause of the failure in the sample and the three-dimensional analysis of the failure site in the sample.

In accordance with the sixth aspect of the present invention, the method can determine the failure-containing region by scanningly irradiating the sample with the laser beam, and thereafter analyze the cause of the failure in the failure-containing region by fixedly irradiating only the failure-containing region with the laser beam and changing the applied voltage.

In accordance with the seventh aspect of the present invention, the method can avoid damages to the sample due to the continuous irradiation with the laser beam.

In accordance with the eighth aspect of the present invention, the method can analyze the presence or absence of the cause of the failure of the three types at the timed instants at which the occurrence of the failure significantly affects a variation in current value.

In accordance with the ninth aspect of the present invention, the method can analyze the presence or absence of the cause of the failure of the three types at the timed instants at which the occurrence of the failure significantly affects a variation in current value, and achieves the analysis of the cause of the failure in the sample and the three-dimensional analysis of the failure site in the sample by the use of the single-wavelength laser beam.

In accordance with the tenth aspect of the present invention, the apparatus uses the plurality of laser beams differing in wavelength from each other for failure analysis to achieve the analysis of the cause of the failure in the sample and the three-dimensional analysis of the failure site in the sample.

In accordance with the eleventh aspect of the present invention, the apparatus comprises the plurality of laser beam sources to provide the laser beams differing in wavelength from each other from the respective laser beam sources.

In accordance with the twelfth aspect of the present invention, the wavelength converter converts the wavelength of the laser beam to eliminate the need to provide individual laser beam sources for providing the laser beams differing in wavelength from each other, thereby simplifying the construction of the apparatus.

In accordance with the thirteenth aspect of the present invention, the apparatus can analyze three types of failure, i.e. a pn junction defect, a Schottky junction defect, and a faulty site in a metal interconnect line, in a semiconductor device employing a silicon substrate.

In accordance with the fourteenth aspect of the present invention, the apparatus can determine the failure-containing region in which some form of failure occurs by scanningly irradiating the sample with the laser beam, and analyze the cause and site of the failure in the failure-containing region by fixedly irradiating the failure-containing region with the laser beam and converting the wavelength of the laser beam.

In accordance with the fifteenth aspect of the present invention, changing the voltage applied to the sample while irradiating the sample with the laser beam allows the analysis of the cause of the failure in the sample and the three-dimensional analysis of the failure site in the sample.

In accordance with the sixteenth aspect of the present invention, the apparatus can determine the failure-containing region in which some form of failure occurs by scanningly irradiating the sample with the laser beam, and analyze the cause and site of the failure in the failure-containing region by fixedly irradiating the failure-containing region with the laser beam and changing the applied voltage.

In accordance with the seventeenth aspect of the present invention, the apparatus can avoid damages to the sample due to the continuous irradiation with the laser beam.

In accordance with the eighteenth aspect of the present invention, the apparatus can analyze the presence or absence of the cause of the failure of the three types at the timed instants at which the occurrence of the failure significantly affects a variation in current value.

It is therefore an object of the present invention to provide a method of analyzing failure which can diagnose and localize a failure in a sample only by reference to a current image produced by laser beam irradiation, and an apparatus for analyzing a failure which can implement the method.

These and other objects, features, aspects and advantages of the present invention will become more apparent from the following detailed description of the present invention when taken in conjunction with the accompanying drawings.

BRIEF DESCRIPTION OF THE DRAWINGS

FIG. 17 is a block diagram of a background art failure analysis apparatus.

DESCRIPTION OF THE PREFERRED EMBODIMENTS

First Preferred Embodiment

Figure 1:
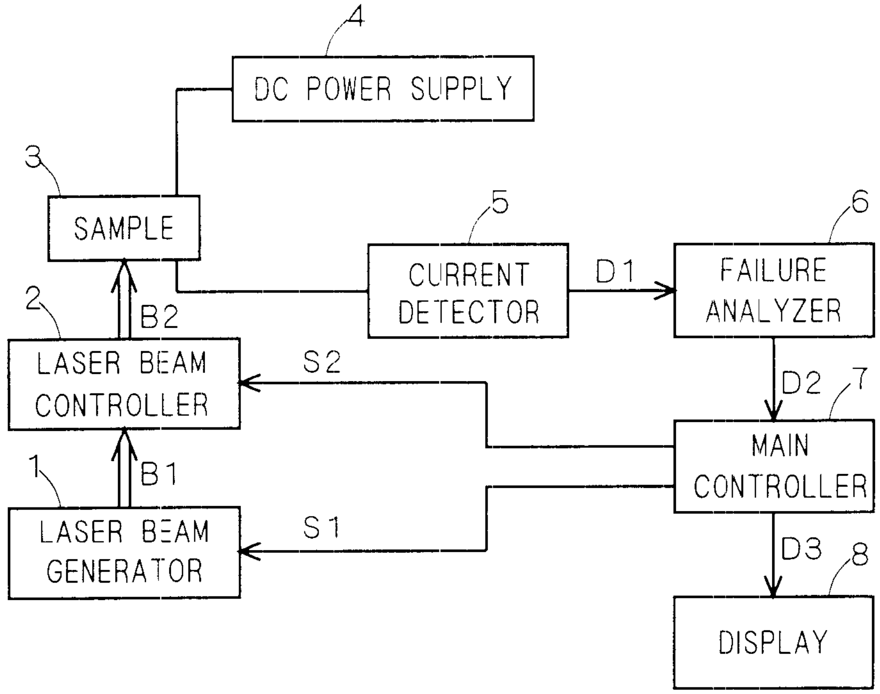
FIG. 1 is a block diagram of a failure analysis apparatus according to a first preferred embodiment of the present invention.

FIG. 1 is a block diagram of a failure analysis apparatus according to a first preferred embodiment of the present invention. As shown in FIG. 1, the failure analysis apparatus according to the first preferred embodiment comprises a laser beam generator 1; a laser beam controller 2 between the laser beam generator 1 and a sample 3; a DC power supply 4 and a current detector 5 both connected to the sample 3; a failure analyzer 6 having an input connected to an output of the current detector 5; a main controller 7 having an input connected to an output of the failure analyzer 6; and a display 8 having an input connected to an output of the main controller 7. An input of the laser beam generator 1 and an input of the laser beam controller 2 are connected to respective outputs of the main controller 7.

The laser beam controller 2 includes an optical system such as a lens, a scanner for controlling the path of a laser beam, and the like. The sample 3 is a semiconductor chip such as an LSI chip or a semiconductor wafer. The current detector 5 includes a high-speed micro-current detector for detecting current flowing in the sample 3. The main controller 7 includes a signal processor such as a MPU (Micro Processing Unit) and the like. The display 8 includes a CRT and the like.

Figure 2:
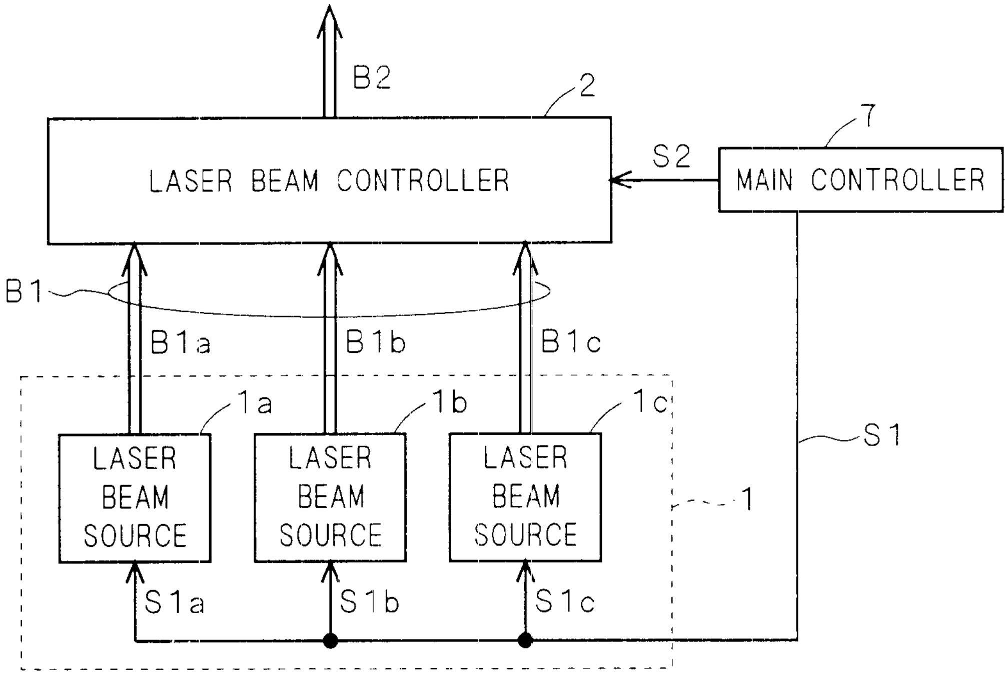
FIG. 2 is a block diagram showing a specific construction of a laser beam generator.

FIG. 2 is a block diagram showing a specific construction of the laser beam generator 1 with the laser beam controller 2 and the main controller 7. The laser beam generator 1 includes a plurality of (three in FIG. 2) laser beam sources 1*a* to 1*c*. The laser beam sources 1*a* to 1*c* generate laser beams B1*a* to B1*c* having wavelengths of about 1.1 μm, about 1.3 μm, and not less than 2.0 μm, respectively. In practice, the laser beam sources 1*a* to 1*c* are set so that the centers of scan regions (visual fields) thereof coincide with each other. The main controller 7 provides control signals S1*a* to S1*c* to the laser beam sources 1*a* to 1*c*, respectively. In response to the control signals S1*a* to S1*c*, one of the three laser beam sources 1*a* to 1*c* is selected, and one of the laser beams B1*a* to B1*c* is used as a laser beam B1 shown in FIG. 1.

Figure 3:
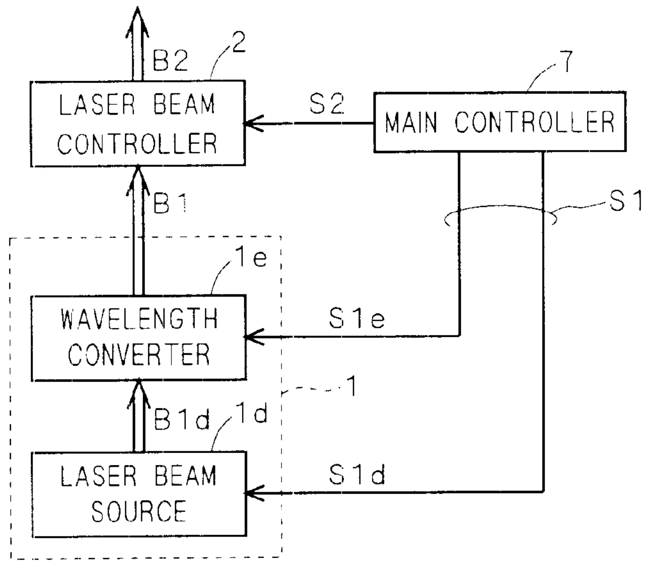
FIG. 3 is a block diagram showing another specific construction of the laser beam generator.

FIG. 3 is a block diagram showing another specific construction of the laser beam generator 1 with the laser beam controller 2 and the main controller 7. The laser beam generator 1 of FIG. 3 includes a laser beam source 1*d* receiving a control signal S1*d* from the main controller 7 to generate a laser beam B1*d* having a predetermined wavelength, and a wavelength converter 1*e* between the laser beam source 1*d* and the laser beam controller 2. The wavelength converter 1*e* converts the wavelength of the laser beam B1*d* generated by the laser beam source 1*d* to provide the laser beam B1. In response to a control signal S1*e* from the main controller 7, the wavelength converter 1*e* can set the wavelength of the laser beam B1 at least at about 1.1 μm, at about 1.3 μm, and at about 2.0 μm. To provide the laser beam B1 of 1.1 μm in wavelength when the laser beam source 1*d* generates the laser beam B1*d* having a wavelength of, e.g., 1.1 μm, the wavelength converter 1*e* need not carry out the waveform conversion of the laser beam. The wavelength converter 1*e* includes, for example, a wavelength converting element, such as a domain inversion crystal, for performing a wavelength conversion by utilizing an optical parametric effect.

Figure 4:
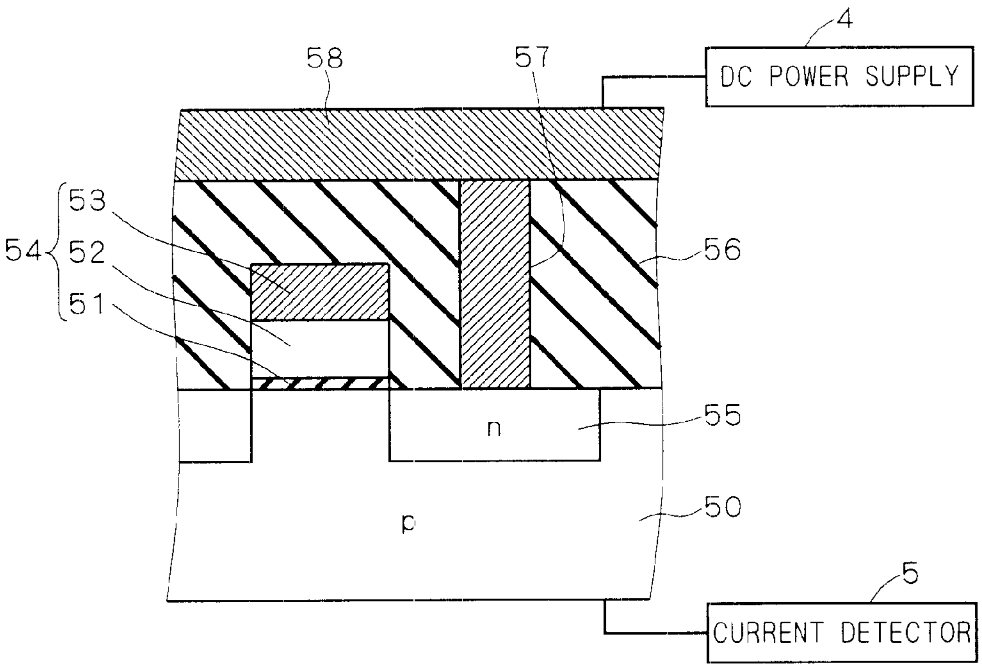
FIG. 4 is a cross-sectional view showing an example of specific constructions of a sample.

FIG. 4 is a cross-sectional view showing an example of specific constructions of the sample 3 with the DC power supply 4 and the current detector 5. A gate structure 54 having a multilayer structure including a gate oxide film 51, a polysilicon layer 52 and a metal silicide layer 53 arranged in stacked relation in the order named is selectively formed on an upper main surface of a p-type silicon substrate 50. An n-type source/drain region 55 is selectively formed in the upper main surface of the silicon substrate 50. An interlayer insulation film 56 is formed to cover the gate structure 54 and part of the upper main surface of the silicon substrate 50 except where the gate structure 54 is formed. A metal interconnect line 58 is formed on the interlayer insulation film 56. A contact hole 57 filled with a metal plug is selectively formed in the interlayer insulation film 56 to establish an electric connection between the metal interconnect line 58 and the source/drain region 55. The metal interconnect line 58 is connected to the DC power supply 4. The lower main surface (backside) of the silicon substrate 50 is connected to the current detector 5.

Description will be given on a method of failure analysis according to the first preferred embodiment using the failure analysis apparatus shown in FIG. 1. Based on a control signal S1 from the main controller 7, the laser beam generator 1 generates the laser beam B1 of about 1.1 μm in wavelength. The laser beam controller 2 controls the path of the laser beam B1 based on a control signal S2 from the main controller 7, and scans the backside of the sample 3 with a laser beam B2. The current detector 5 detects current caused to flow in the sample 3 by the application (optional) of a predetermined voltage from the DC power supply 4 and the irradiation with the laser beam B2 from the laser beam controller 2, to input the detected current as data D1 to the failure analyzer 6. Based on the data D1, the failure analyzer 6 converts a change in current into brightness to produce a current image (referred to hereinafter as a "first current image" in the first preferred embodiment) in the form of a two-dimensional image. The failure analyzer 6 stores therein the produced first current image.

Next, based on the control signal S1 from the main controller 7, the laser beam generator 1 generates the laser beam B1 of about 1.3 μm in wavelength. The laser beam controller 2 controls the path of the laser beam B1 based on the control signal S2 from the main controller 7, and scans the backside of the sample 3 with the laser beam B2. By repeating the above-mentioned operation, the failure analyzer 6 produces a current image (referred to hereinafter as a "second current image" in the first preferred embodiment) in the form of a two-dimensional image, and stores therein the produced second current image.

Next, based on the control signal S1 from the main controller 7, the laser beam generator 1 generates the laser beam B1 of not less than 2.0 μm in wavelength. The laser beam controller 2 scans the backside of the sample 3 with the laser beam B2 in the above-mentioned manner. The failure analyzer 6 produces a current image (referred to hereinafter as a "third current image" in the first preferred embodiment) in the form of a two-dimensional image in the above-mentioned manner, and stores therein the produced third current image.

By reference to the stored first to third current images, the failure analyzer 6 analyzes the cause and specific site of a failure in a failure-containing region in which some form of failure occurs. More specifically, it is judged that a high-resistance fault in the metal interconnect line 58 or the contact hole 57 occurs in the failure-containing region which appears in all of the first to third current images. It is judged that a Schottky junction defect between the contact hole 57 and the source/drain region 55 occurs in the failure-containing region which appears in the first and second current images but does not appear in the third current image. Also, it is judged that a pn junction defect between the silicon substrate 50 and the source/drain region 55 occurs in the failure-containing region which appears in the first current image but does not appear in the second and third current images.

Figure 5:
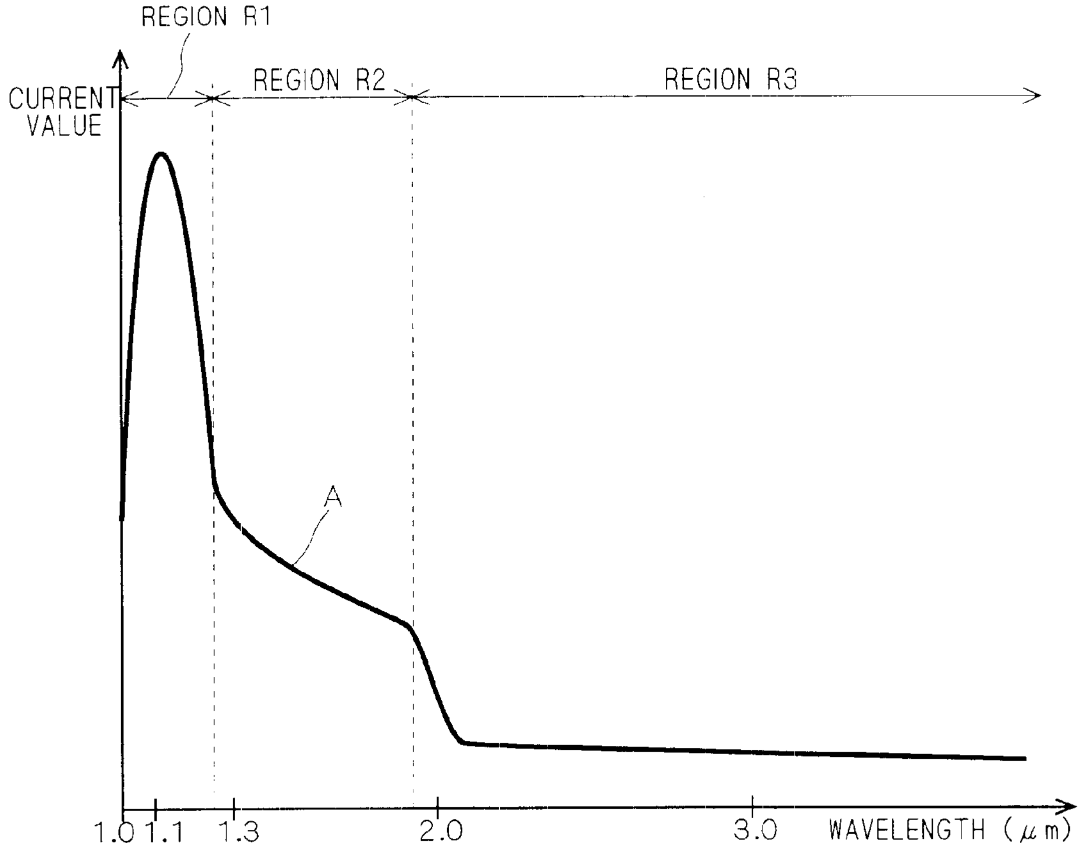
FIG. 5 is a graph showing an example of normal characteristics.

A method of analyzing the cause of a failure by the failure analyzer 6 will be described below. FIG. 5 is a graph showing an example of the relationship (referred to hereinafter as a "normal characteristic") between the wavelength of the laser beam B2 from the laser beam controller 2 and the value of current observed by the current detector 5 for the sample 3 containing no failure. As shown in FIG. 5, the normal characteristic A is divided into three regions R1 to R3 in accordance with the wavelength of the laser beam B2. For example, inflection points of the normal characteristic A may be used as the boundaries between the regions R1 to R3. In the region R1, all of the pn junction defect, the Schottky junction defect, and the high-resistance fault in the metal interconnect line and the like affect a variation in the observed current value. The wavelength of 1.1 μm is included in the region R1. In the region R2, the Schottky junction defect and the high-resistance fault in the metal interconnect line and the like affect a variation in the observed current value. The wavelength of 1.3 μm is included in the region R2. In the region R3, only the high-resistance fault in the metal interconnect line and the like affects a variation in the observed current value. The wavelength of 2.0 μm is included in the region R3.

Figure 6:
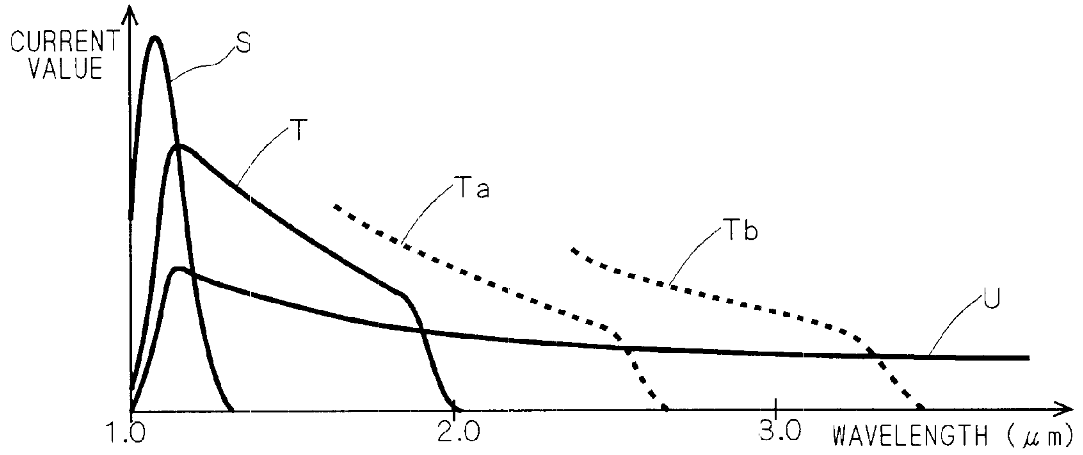
FIG. 6 is a graph showing the normal characteristic of FIG. 5 as separated into regions.

FIG. 6 is a graph showing the normal characteristic A of FIG. 5 as separated into the regions R1 to R3. Characteristics S, T, U shown in FIG. 6 correspond to the regions R1, R2, R3 of FIG. 5, respectively. In other words, a combination of the characteristics S, T, U shown in FIG. 6 is the normal characteristic A shown in FIG. 5. With reference to FIG. 6, the characteristic S shows an abruptly decaying current value at a wavelength of not less than 1.1 μm (approximately equal to the band gap energy of silicon in terms of energy). The characteristic T shows an abruptly decaying current value at a wavelength not less than the wavelength (about 1.8 μm in FIG. 6) corresponding to a Schottky barrier potential difference. The characteristic T, however, is shifted rightwardly as the Schottky barrier potential difference decreases (see Ta and Tb of FIG. 6). For the characteristic U, the current value depends only on the transmittance of a beam and there is no abrupt current variation since the irradiated laser beam functions only as a heating source.

Check points of the sample 3 are sequentially irradiated with the laser beam B2. Whether or not each of the check points is the failure-containing region is judged depending on whether or not the current value detected by the current detector 5 for each of the check points coincides with the normal characteristic A shown in FIG. 5.

The failure analyzer 6 inputs data about the cause and specific site of a failure in the failure-containing region in the form of data D2 to the main controller 7. The data D2 is inputted as data D3 from the main controller 7 to the display 8, and is displayed on a screen of the display 8.

In the apparatus for and method of analyzing a failure according to the first preferred embodiment, as described hereinabove, the laser beam B2 with sequentially selected wavelengths scans the sample 3 to produce the first to third current images. Then, the failure analyzer 6 analyzes the cause of the failure by reference to the first to third current images. When the sample 3 has, for example, the structure shown in FIG. 4, the failure analyzer 6 can not only analyze the cause of the failure but also three-dimensionally analyze the failure site of the failure-containing region, i.e. whether the failure site is present (1) between the silicon substrate 50 and the source/drain region 55 which constitute a pn junction, (2) between the contact hole 57 and the source/drain region 55 which constitute a Schottky junction or (3) in the metal interconnect line 58 or the contact hole 57 which serve as a conductor.

Second Preferred Embodiment

The failure analysis apparatus according to a second preferred embodiment of the present invention features the laser beam controller 2 shown in FIG. 1 which has, in addition to a first function of scanningly irradiating the sample 3 with the laser beam B2, a second function of fixedly irradiating a specific site of the sample 3 with the laser beam B2. More specifically, the second function is accomplished by the main controller 7 controlling the operation of a beam path control element (e.g., an acoustooptical device or an element such as a galvanometer mirror) included in the laser beam controller 2. The remaining constructions of the apparatus of the second preferred embodiment are similar to those of the apparatus of the first preferred embodiment shown in FIG. 1.

Description will be given on a method of failure analysis according to the second preferred embodiment. First, based on the control signal S1 from the main controller 7, the laser beam generator 1 generates the laser beam B1 of about 1.1 μm in wavelength. The laser beam controller 2 controls the path of the laser beam B1 based on the control signal S2 from the main controller 7, and scans the backside of the sample 3 with the laser beam B2. The current detector 5 detects current caused to flow in the sample 3 by the application (optional) of a predetermined voltage from the DC power supply 4 and the irradiation with the laser beam B2 from the laser beam controller 2, to input the detected current as the data D1 to the failure analyzer 6.

Based on the data D1, the failure analyzer 6 converts a change in current into brightness to produce a current image in the form of a two-dimensional image. Further, based on the produced current image, the failure analyzer 6 determines the failure-containing region in the sample 3 in which any one of the followings occurs: (1) the pn junction defect between the silicon substrate 50 and the source/drain region 55, (2) the Schottky junction defect between the contact hole 57 and the source/drain region 55, and (3) the high-resistance fault in the metal interconnect line 58 or the contact hole 57. The failure analyzer 6 then inputs data about the position of the failure-containing region as the data D2 to the main controller 7.

Next, based on the data D2, the main controller 7 computes the position of the failure-containing region in the sample 3. Based on the control signal S1 from the main controller 7, the laser beam generator 1 generates the laser beam B1 of about 1.3 μm in wavelength. Based on the control signal S2 from the main controller 7, the laser beam controller 2 fixes the path of the laser beam B1 at the position of the failure-containing region computed by the main controller 7. Thus, the failure-containing region in the sample 3 is fixedly irradiated with the laser beam B2 of about 1.3 μm in wavelength. The current detector 5 detects current caused to flow in the sample 3 by the irradiation with the laser beam B2, to input the detected current as the data D1 to the failure analyzer 6. Based on the data D1, the failure analyzer 6 judges the presence or absence of the Schottky junction defect and the high-resistance fault in the metal interconnect line.

With the path of the laser beam B1 continuously fixed at the failure-containing region, the laser beam generator 1 generates the laser beam B1 of not less than 2.0 μm in wavelength based on the control signal S1 from the main controller 7. Thus, the failure-containing region in the sample 3 is fixedly irradiated with the laser beam B2 of not less than 2.0 μm in wavelength. The current detector 5 detects current caused to flow in the sample 3 by the irradiation with the laser beam B2, to input the detected current as the data D1 to the failure analyzer 6. Based on the data D1, the failure analyzer 6 judges the presence or absence of the high-resistance fault in the metal interconnect line.

In the apparatus for and method of analyzing a failure according to the second preferred embodiment, as described hereinabove, the failure-containing region in the sample 3 is determined by scanning the laser beam B2 of about 1.1 μm in wavelength, and thereafter only the determined failure-containing region is subjected to the irradiation with the laser beam B2 with sequentially selected wavelengths and the analysis of the cause of the failure. Therefore, the apparatus and method of the second preferred embodiment can reduce the processing time required for the analysis of the caused of the failure, as compared with the apparatus and method of the first preferred embodiment in which the sample 3 is scanningly irradiated with all of the laser beams B2 of about 1.1 μm, about 1.3 μm and not less than 2.0 μm in wavelength.

Third Preferred Embodiment

Figure 7:
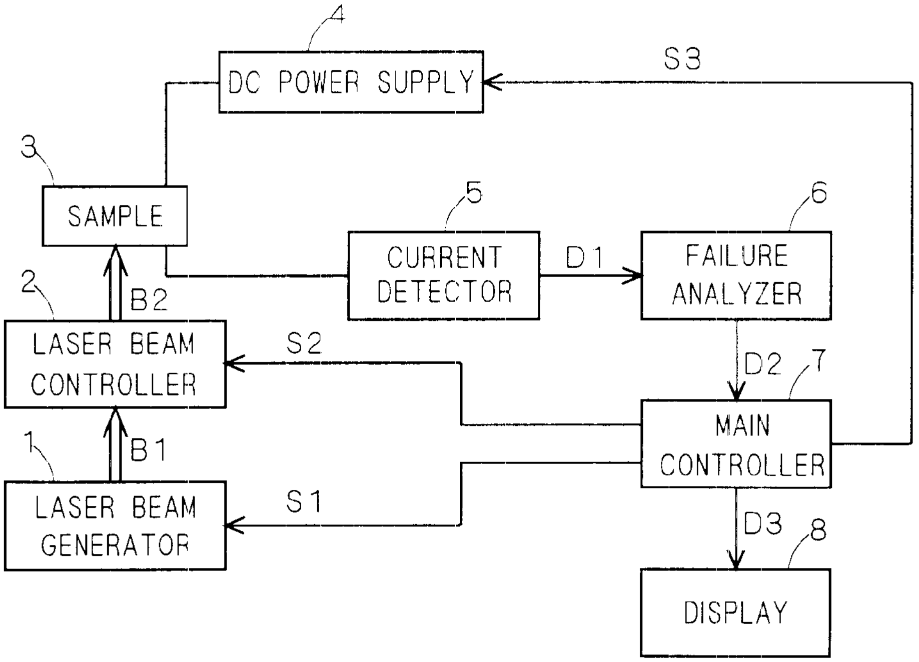
FIG. 7 is a block diagram of the failure analysis apparatus according to a third preferred embodiment of the present invention.

FIG. 7 is a block diagram of the failure analysis apparatus according to a third preferred embodiment of the present invention. An electric connection is established between the DC power supply 4 and the main controller 7 to render the value of voltage (or current) applied from the DC power supply 4 to the sample 3 variably controllable by a control signal S3 from the main controller 7. The remaining constructions of the apparatus of the third preferred embodiment are similar to those of the apparatus of the second preferred embodiment.

Description will be given on a method of failure analysis according to the third preferred embodiment using the failure analysis apparatus shown in FIG. 7. As in the second preferred embodiment, the failure-containing region in the sample 3 is determined by scanningly irradiating the sample 3 with the laser beam B2 of about 1.1 μm in wavelength. Next, while the failure-containing region in the sample 3 is fixedly irradiated with the laser beam B2 of about 1.1 μm in wavelength, the value of the voltage applied from the DC power supply 4 to the sample 3 is changed within a predetermined range in response to the control signal S3 from the main controller 7. The current detector 5 detects current caused to flow in the sample 3 by the application of the voltage from the DC power supply 4 and the irradiation with the laser beam B2 in corresponding relationship with changes in the applied voltage value, to input the detected current as the data D1 to the failure analyzer 6. Based on the data D1, the failure analyzer 6 analyzes the cause of a failure in the failure-containing region.

Figure 8:
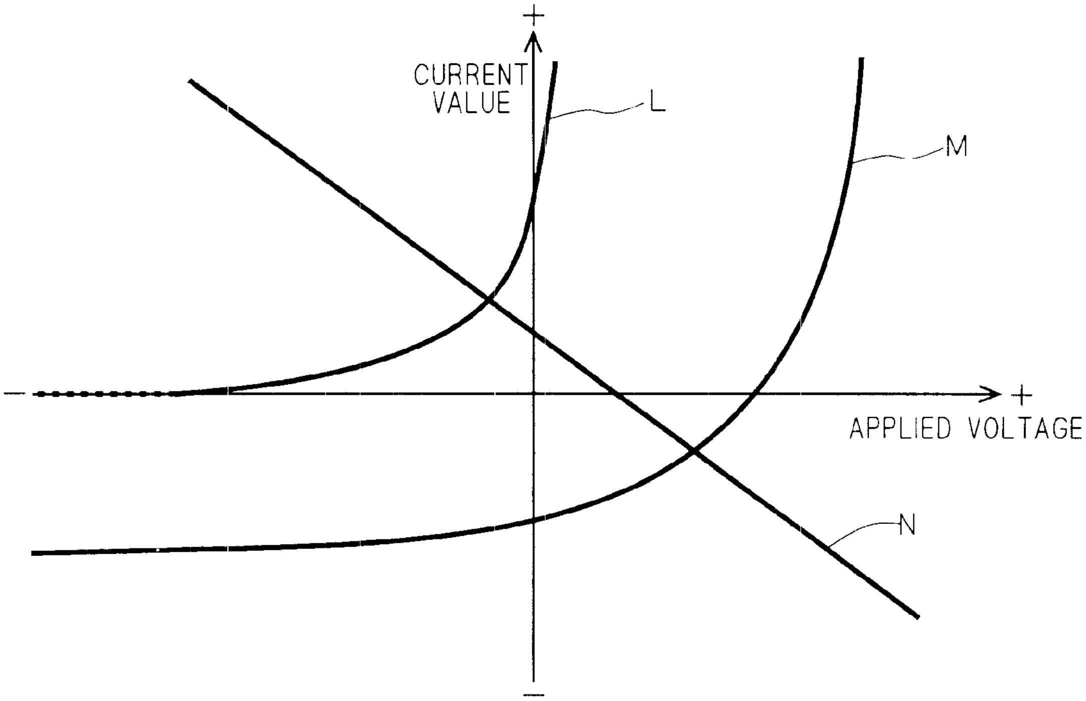
FIG. 8 is a graph showing the value of current flowing in the sample versus the value of voltage applied to the sample for different causes of failures.

A method of analyzing the cause of a failure by the failure analyzer 6 will be described below. FIG. 8 is a graph showing the value of the current flowing in the sample 3 versus the value of the voltage applied from the DC power supply 4 to the sample 3 for different causes of failures. Characteristics L, M, N shown in FIG. 8 correspond to the pn junction defect, the Schottky junction defect, and the high-resistance fault in the metal interconnect line and the like, respectively. It should be noted that the current value shown in FIG. 8 is the value of the current caused to flow in the sample 3 by the irradiation with the laser beam B2 which is subtracted from the value of the current detected by the current detector 5. That is, the value of the current shown in FIG. 8 is the value of the current caused to flow in the sample 3 by only the applied voltage from the DC power supply 4, and yet is obtained by comparing a failure site in the sample 3 and a failure-free normal site relative to each other and subtracting the value of current flowing through the normal site from the value of current flowing through the failure site. The current observed when the applied voltage is 0 V is an induced current itself. The characteristics L and M show currents induced by photoexcitation, and the characteristic N shows a current induced by thermal excitation. The value of the current caused to flow in the sample 3 by only the applied voltage from the DC power supply 4 is obtained by calculating a difference between the current value observed when the voltage is applied from the DC power supply 4 to the sample 3 and the current value observed when no voltage is applied.

As illustrated in FIG. 8, the tendency of observed current to change in response to the applied voltage and the direction of current flowing in the sample 3 in response to the voltages are different depending on the causes of failures and the sources of excitation. It is therefore understood that the causes of failures are clearly classified by observing the changes in observed current in response to the applied voltage. For instance, the characteristic L is obtained when the cause of a failure in the failure-containing region in the sample 3 is the pn junction defect, and the characteristic M is obtained when the cause of a failure is the Schottky junction defect. In other words, the cause of the failure in the failure-containing region is analyzed depending on which one of the characteristics L, M and N is obtained as a result of changes in the value of the voltage applied from the DC power supply 4 to the sample 3.

In the apparatus for and method of analyzing a failure according to the third preferred embodiment, as described hereinabove, the cause of the failure in the failure-containing region in the sample 3 is analyzed based on the detection result from the current detector 5 which is obtained when the value of the voltage applied from the DC power supply 4 to the sample 3 is changed while the failure-containing region in the sample 3 is fixedly irradiated with the laser beam B2. This achieves the analysis of the cause of the failure in the sample 3 and the three-dimensional analysis of the failure site.

Fourth Preferred Embodiment

In the above-mentioned second and third preferred embodiments, the cause of the failure is analyzed by changing the wavelength of the laser beam B2 or changing the value of the voltage applied from the DC power supply 4 to the sample 3 while the previously determined failure-containing region in the sample 3 is fixedly irradiated with the laser beam B2. A fourth preferred embodiment of the present invention proposes an apparatus for and method of analyzing failure which can avoid damages to the sample 3 which are entailed by the fixed irradiation with the laser beam B2.

Figure 9:
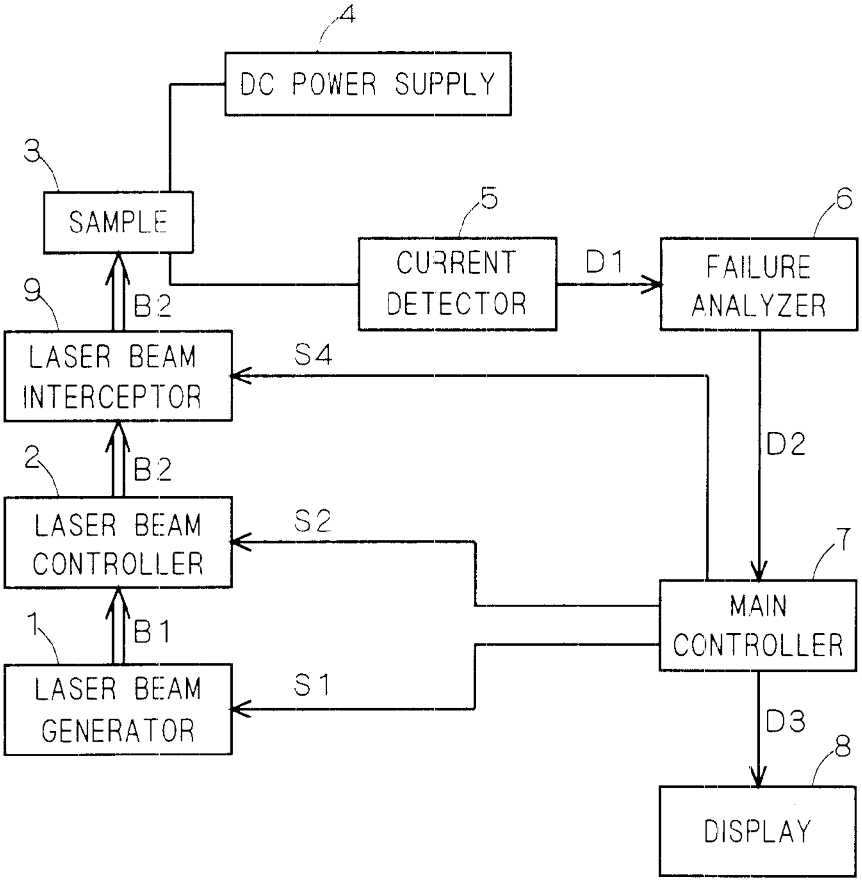
FIG. 9 is a block diagram of the failure analysis apparatus according to a fourth preferred embodiment of the present invention.

FIG. 9 is a block diagram of the failure analysis apparatus according to the fourth preferred embodiment. A laser beam interceptor 9 for intermittently intercepting (or changing) the irradiation of the sample 3 with the laser beam B2 is disposed in an optical path of the laser beam B2 between the laser beam controller 2 and the sample 3. The laser beam interceptor 9 may include, for example, a known shutter mechanism and the like. The operation of the laser beam interceptor 9 is controlled by a control signal S4 from the main controller 7. Alternatively, the fourth preferred embodiment may be configured such that a laser beam source for generating a pulsed laser is used as each of the laser beam sources 1*a* to 1*d* of the laser beam generator 1, in place of providing the laser beam interceptor 9. The remaining constructions of the apparatus of the fourth preferred embodiment are similar to those of the apparatus of the second or third preferred embodiment.

Figure 10:
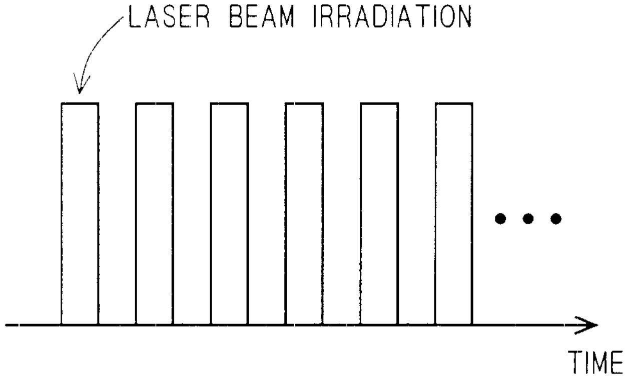
FIG. 10 is a timing chart showing a waveform of a laser beam for irradiation of a failure-containing region in the sample.

FIG. 10 is a timing chart showing the waveform of the laser beam B2 for irradiation of the failure-containing region in the sample 3 when analyzing the cause of the failure after the failure-containing region in the sample 3 is determined. As shown in FIG. 10, the sample 3 is not continuously irradiated with the laser beam B2, but the failure-containing region in the sample 3 is intermittently irradiated with the laser beam B2 in the form of a pulsed laser having a predetermined pulse width.

As described hereinabove, the apparatus for and method of analyzing a failure according to the fourth preferred embodiment can avoid damages to the sample 3 which are entailed by continuous irradiation of the sample 3 at one point with the high-power laser beam B2, e.g. by heat generation, thereby achieving the analysis of the cause of the failure without damages to the sample 3.

Fifth Preferred Embodiment

Figure 11:
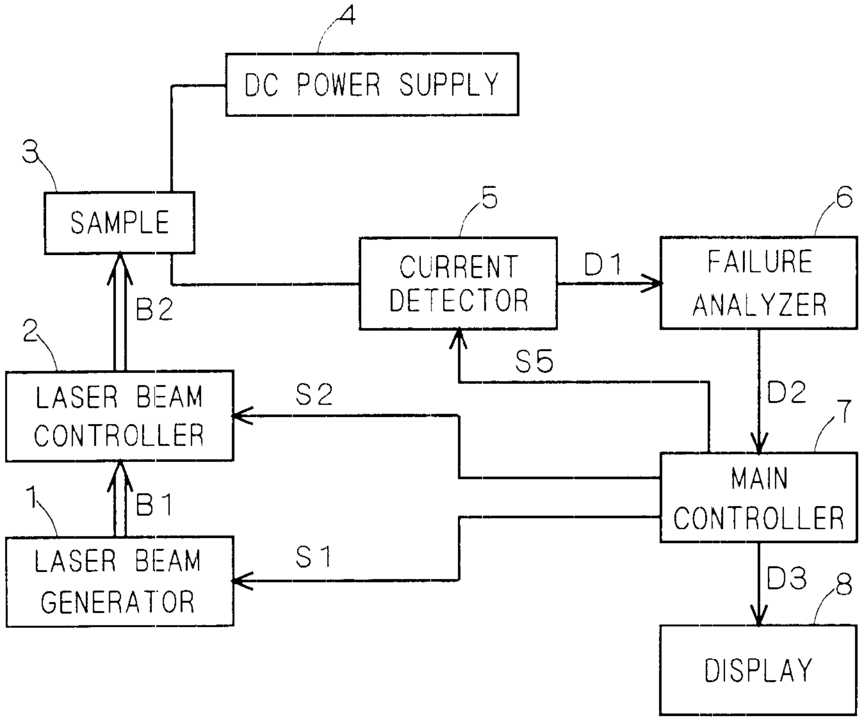
FIG. 11 is a block diagram of the failure analysis apparatus according to a fifth preferred embodiment of the present invention.

FIG. 11 is a block diagram of the failure analysis apparatus according to a fifth preferred embodiment of the present invention. An electric connection is established between the main controller 7 and the current detector 5 to render the timing of detection of the current flowing through the sample 3 by the current detector 5 controllable by a control signal S5 from the main controller 7. The remaining constructions of the apparatus of the fifth preferred embodiment are similar to those of the apparatus of the second preferred embodiment.

Description will be given on a method of failure analysis according to the fifth preferred embodiment using the failure analysis apparatus shown in FIG. 11. As in the second preferred embodiment, the failure-containing region in the sample 3 is determined by scanningly irradiating the sample 3 with the laser beam B2 of about 1.1 μm in wavelength. Next, the failure-containing region in the sample 3 is instantaneously (e.g., for a length of time shorter than a time constant τl ) irradiated with the laser beam B2 of about 1.1 μm in wavelength.

Figure 12:
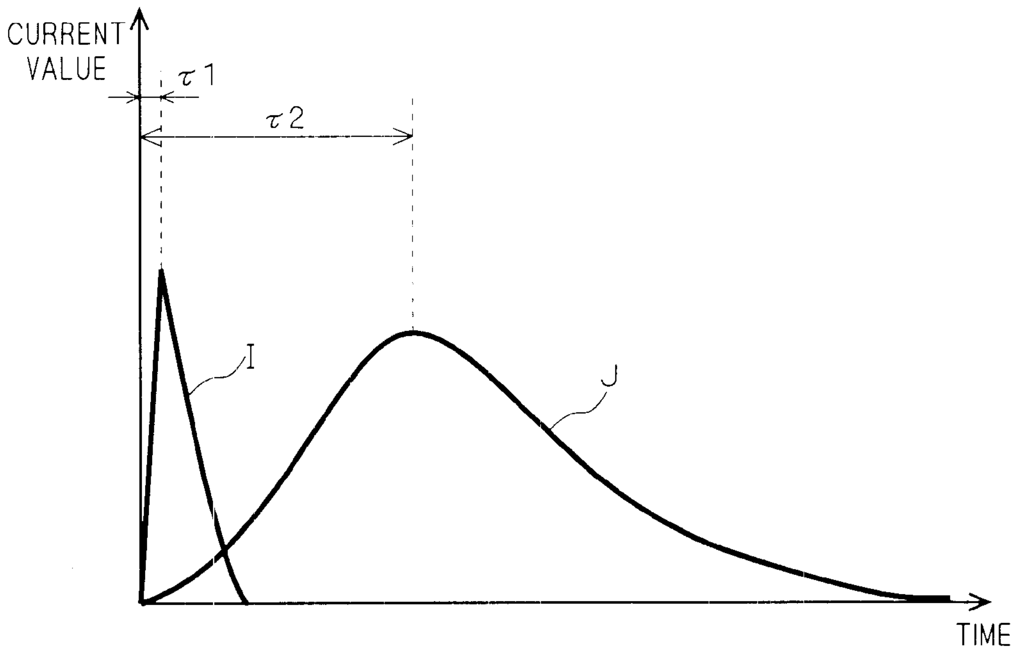
FIG. 12 is a graph schematically showing changes in current flowing in the sample with time after an instantaneous irradiation of the sample with the laser beam.

FIG. 12 is a graph schematically showing a change in current flowing in the sample 3 with time immediately after the instantaneous irradiation of the sample 3 with the laser beam. A characteristic I with the time constant τl shows the value of the current induced by photoexcitation caused by the laser beam irradiation, which corresponds to current generated at the pn junction and the Schottky junction. A characteristic J with a time constant τ2 shows the value of the current induced by thermal excitation caused by the laser beam irradiation, which corresponds to current generated in the metal interconnect line. As shown in FIG. 12, the characteristics I and J have significantly different respective time constants τl and τ2 between the instant immediately after the instantaneous irradiation with the laser beam B2 and the instant at which the current value reaches its peak.

In the method of failure analysis according to the fifth preferred embodiment, the current is detected at a plurality of timed instants after the irradiation of the failure-containing region in the sample 3 with the laser beam B2 in corresponding relation to the difference between the time constants τr and τ2 which results from the difference in excitation source (the photoexcitation and the thermal excitation) of electron-hole pairs generated by irradiation with the laser beam B2. More specifically, the laser beam controller 2 instantaneously irradiates the failure-containing region in the sample 3 with the laser beam B2, based on the control signal S2 from the main controller 7, and thereafter the current detector 5 detects the current flowing in the sample 3 at the plurality of timed instants corresponding to the time constants τl and τ2, based on the control signal S5 from the main controller 7.

Figure 13:
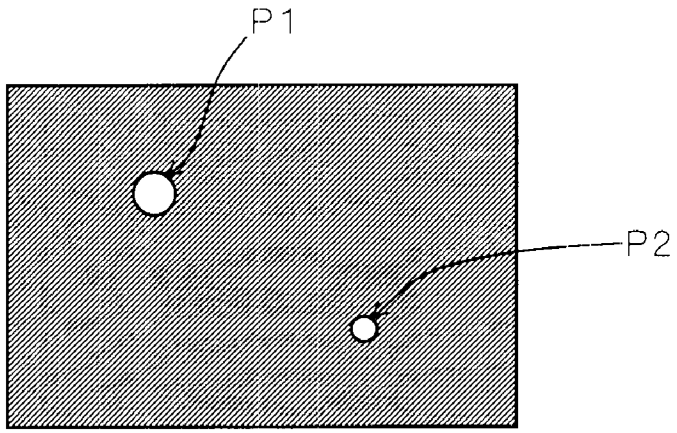
FIGS. 13 and 14 show examples of current images produced by a method of failure analysis according to the fifth preferred embodiment.
Figure 14:
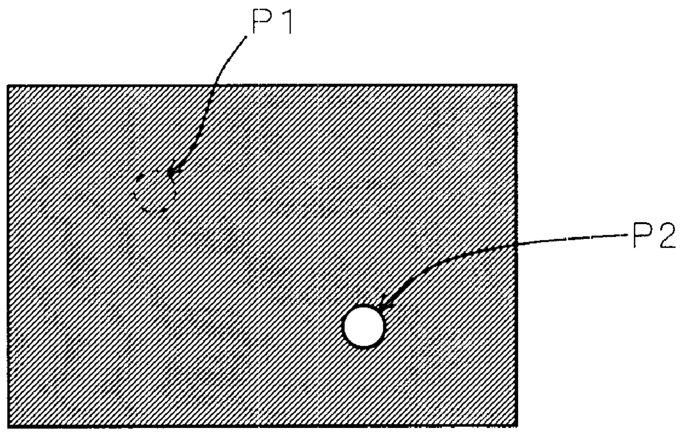

FIGS. 13 and 14 are schematic views of examples of the current images produced by the method of failure analysis according to the fifth preferred embodiment. FIG. 13 shows the current image produced when the current detector 5 detects the current after the time corresponding to the time constant τ7 has elapsed since the irradiation of the failure-containing region in the sample 3 with the laser beam B2. A current generated portion P1 resulting from the photoexcitation appears as a whitish spot and is clearly manifested in the current image. Thus, a comparison relative to a failure-free normal portion will easily allow a judgement to be made as to whether or not the cause of the failure in the failure-containing region is the pn junction and Schottky junction defects. Since the current resulting from the thermal excitation is not sufficiently generated at this point of time as shown in FIG. 12, a current generated portion P2 resulting from the thermal excitation is not sufficiently manifested in the current image. Whether the cause of the failure in the failure-containing region is the pn junction defect or the Schottky junction defect is determined by changing the wavelength of the laser beam B2 or changing the value of the voltage applied from the DC power supply 4 to the sample 3, as described in the second and third preferred embodiments.

FIG. 14 shows the current image produced when the current detector 5 detects the current after the time corresponding to the time constant τ2 has elapsed since the irradiation of the failure-containing region in the sample 3 with the laser beam B2. The current generated portion P2 resulting from the thermal excitation appears as a whitish spot and is clearly manifested in the current image. Thus, a comparison relative to a failure-free normal portion will easily allow a judgement to be made as to whether or not the cause of the failure in the failure-containing region is the high-resistance fault in the metal interconnect line and the like. Since the current resulting from the photoexcitation is completely absent at this point of time as shown in FIG. 12, the current generated portion P1 does not appear in the current image.

In the apparatus for and method of analyzing a failure according to the fifth preferred embodiment, as described hereinabove, the current detector 5 detects the current at the plurality of timed instants after the instantaneous irradiation of the failure-containing region in the sample 3 with the laser beam B2 in corresponding relation to the difference between the time constants τl and τ2 which results from the difference in excitation source of the carriers. Therefore, the apparatus and method according to the fifth preferred embodiment can analyze the presence or absence of the cause of the failure at the timed instants at which the occurrence of the failure significantly affects a variation in observed current value, and achieve the analysis of the cause of the failure in the sample 3 and the three-dimensional analysis of the failure site in the sample 3 by the use of the single-wavelength laser beam B2.

Sixth Preferred Embodiment

Figure 15:
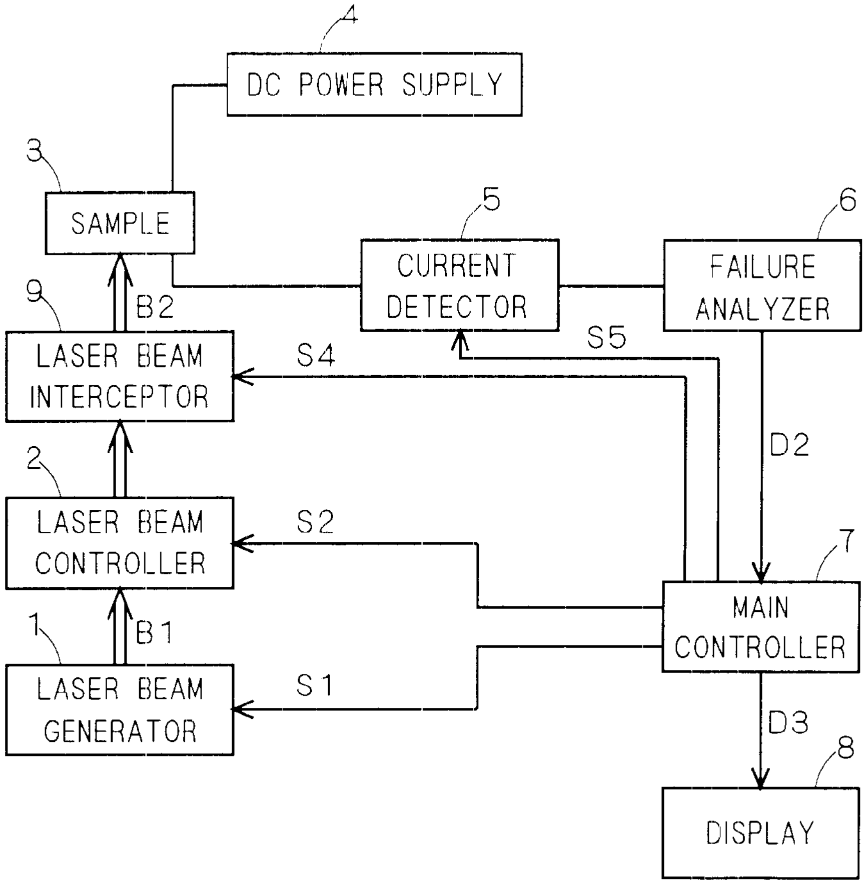
FIG. 15 is a block diagram of the failure analysis apparatus according to a sixth preferred embodiment of the present invention.

FIG. 15 is a block diagram of the failure analysis apparatus according to a sixth preferred embodiment of the present invention. As shown in FIG. 15, the failure analysis apparatus according to the sixth preferred embodiment further comprises the laser beam interceptor 9 according to the fourth preferred embodiment and the current detector 5 according to the fifth preferred embodiment for detecting the current at the timed instants controllable by the main controller 7, in addition to the components of the failure analysis apparatus according to the first preferred embodiment.

Figure 16:
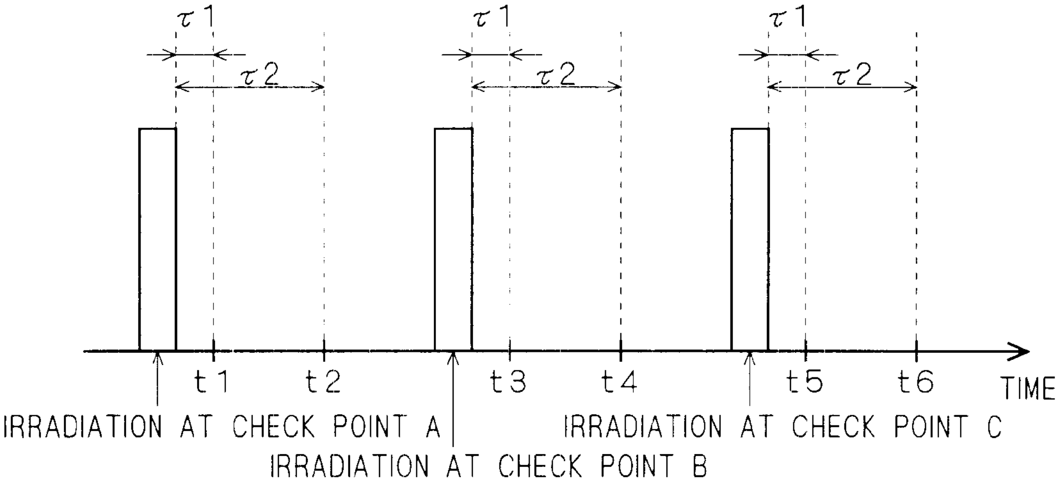
FIG. 16 is a timing chart for illustrating the method of failure analysis according to the sixth preferred embodiment.

FIG. 16 is a timing chart for illustrating the method of analyzing a failure according to the sixth preferred embodiment. With reference to FIGS. 15 and 16, the method of analyzing a failure according to the sixth preferred embodiment will be specifically described. Based on the control signal S1 from the main controller 7, the laser beam generator 1 generates the laser beam B1 of about 1.1 μm in wavelength. The laser beam controller 2 controls the path of the laser beam B1 based on the control signal S2 from the main controller 7, and scans a plurality of check points of the backside of the ample 3 with the laser beam B2. In this scanning step, the laser beam interceptor 9 controls the transmission/interception of the laser beam B2 so that the check points of the sample 3 are instantaneously irradiated with the laser beam B2 as in the fifth preferred embodiment, based on the control signal S4 from the main controller 7. The current detector 5 detects the current flowing in the sample 3 at the plurality of timed instants corresponding to the time constants τ1 and τ2 as in the fifth preferred embodiment, based on the control signal S5 from the main controller 7.

The process of instantaneously irradiating the check points with the laser beam B2 and the process of detecting the current at the timed instants corresponding to the time constants τ1 and τ2 are synchronized with each other and repeatedly performed until all of the check points in the sample 3 (or visual field) are scanned. The operations for only three typical check points A, B and C are shown in FIG. 16. Then, the current image is produced by converting the current value observed at each of the timed instants of current detection at each of the check points into brightness. As in the fifth preferred embodiment, the failure analyzer 6 analyzes the cause and site of the failure in the sample 3 for each of the check points.

In the apparatus for and method of analyzing a failure according to the sixth preferred embodiment, as described hereinabove, the instantaneous irradiation with the laser beam B2 and the current detection at the timed instants corresponding to the time constants τl and τ2 are synchronized with each other, and are performed sequentially upon all of the check points in the sample 3. Therefore, the apparatus and method according to the sixth preferred embodiment can achieve the analysis of the cause of the failure and the three-dimensional analysis of the failure site for all of the check points in the sample 3 by the use of the single-wavelength laser beam B2.

While the invention has been described in detail, the foregoing description is in all aspects illustrative and not restrictive. It is understood that numerous other modifications and variations can be devised without departing from the scope of the invention.

What is claimed is:

1. A method of analyzing a failure, comprising the steps of:

(a) irradiating a sample with a laser beam;

(b) detecting a current generated in said sample as a result of the irradiation with said laser beam; and (c) analyzing a failure in said sample, based on a comparison between a plurality of detection results obtained in said step (b) when said sample is irradiated with said laser beam at respective different wavelengths and said wavelengths to identify defects in said sample by associating said defects with a combined current generated by said defects at said respective wavelengths.

2. The method according to claim 1, wherein said sample is irradiated with laser beams of about 1.1 μm, about 1.3 μm, and not less than 2.0 m in wavelength, respectively, in said step (c).

3. The method according to claim 1, wherein said step (a) comprises the steps of:

(a-1) scanningly irradiating said sample with said laser beam; and (a-2) fixedly irradiating a specific site of said sample with said laser beam, one of said steps (a-1) and (a-2) being selectively executed, and wherein said step (c) comprises the steps of:

(c-1) determining a failure-containing region in which some form of failure occurs, based on a detection result obtained in said step (b) when said step (a-1) is executed; and (c-2) analyzing the cause of the failure in said failure-containing region, based on detection results obtained in said step (b) when the wavelength of said laser beam is changed while said failure-containing region is fixedly irradiated with said laser beam in said step (a-2).

4. The method according to claim 3, wherein said current is detected in said step (b) at a plurality of timed instants after irradiation of said failure-containing region with said laser beam, said plurality of timed instants being respectively corresponding to time constants of said current, said time constants being different from each other in excitation source of carriers generated by the irradiation with said laser beam.

5. The method according to claim 3, wherein said sample is irradiated with said laser beam which is intermittently intercepted in said step (a-2).

6. The method according to claim 5, wherein said current is detected in said step (c) at a plurality of timed instants after irradiation of said failure-containing region with said laser beam, said plurality of timed instants being respectively corresponding to time constants of said current, said time constants being different from each other in excitation source of carriers generated by the irradiation with said laser beam.

7. The method according to claim 1, wherein said analyzing identifies said defects in at least one of pn junctions, Schottky junctions, and metal interconnect lines.

8. A method of analyzing a failure, comprising the steps of:

(a) irradiating a sample with a laser beam of a predetermined wavelength;

(b) applying a variable voltage to said sample;

(c) detecting a measured current response curve generated in said sample as a result of the application of said variable voltage and the irradiation with said laser beam; and (d) analyzing a failure in said sample, based on a variable-voltage current response curve detected in said step (c) when said voltage is changed while said sample is irradiated with said laser beam, by comparing said variable-voltage current response curve to a current response curve from a failure-free site to thereby analyze the causes of failures.

9. The method according to claim 8, wherein said step (a) comprises the steps of:

(a-1) scanningly irradiating said sample with said laser beam; and (a-2) fixedly irradiating a specific site of said sample with said laser beam, one of said steps (a-1) and (a-2) being selectively executed, and wherein said step (d) comprises the steps of:

(d-1) determining a failure-containing region in which some form of failure occurs, based on a detection result obtained in said step (c) when said step (a-1) is executed; and (d-2) analyzing the cause of the failure in said failure-containing region, based on a detection result obtained in said step (c) when said voltage is changed while said failure-containing region is fixedly irradiated with said laser beam in said step (a-2).

10. The method according to claim 9, wherein said sample is irradiated with said laser beam which is intermittently intercepted in said step (a-2).

11. The method according to claim 9, wherein said current is detected in said step (c) at a plurality of timed instants after irradiation of said failure-containing region with said laser beam, said plurality of timed instants being respectively corresponding to time constants of said current, said time constants being different from each other in excitation source of carriers generated by the irradiation with said laser beam.

12. The method according to claim 8, wherein said analyzing identifies said defects in at least one of pn junctions, Schottky junctions, and metal interconnect lines.

13. A method of analyzing a failure, comprising the steps of:

(a) irradiating a sample with a laser beam of a predetermined wavelength;

(b) detecting a current generated in said sample as a result of the irradiation with said laser beam at a plurality of timed instants after the irradiation of said sample with said laser beam, said plurality of timed instants being respectively corresponding to time constants of said current, said time constants being different from each other in excitation source of carriers generated by the irradiation with said laser beam; and (c) analyzing a failure in said sample, based on detection results obtained in said step (b).

14. An apparatus for analyzing a failure, comprising:

a laser beam generator configured to selectively generate a plurality of laser beams;

a current detector configured to detect a current generated in a sample as a result of irradiation with said laser beams; and a failure analyzer configured to analyze a failure in said sample, based on a comparison between a plurality of detection results obtained from said current detector by irradiating said sample with said plurality of laser beams at respective different wavelengths and said wavelengths to identify defects in said sample by associating said defects with a combined current generated by said defects at said respective wavelengths.

15. The apparatus according to claim 14, wherein said laser beam generator comprises a plurality of laser beam sources for generating said plurality of laser beams, respectively.

16. The apparatus according to claim 14, wherein said laser beam generator comprises:

a laser beam source configured to generate a laser beam of a predetermined wavelength; and a wavelength converter configured to convert said predetermined wavelength of said laser beam generated by said laser beam source to generate said plurality of laser beams.

17. The apparatus according to claim 14, wherein said plurality of laser beams include laser beams of about 1.1 $\mu$m, about 1.3 $\mu$m, and not less than 2.0 $\mu$m in wavelength, respectively.

18. The apparatus according to claim 14, further comprising a laser beam controller having a first function of scanningly irradiating said sample with said laser beam, and a second function of fixedly irradiating a specific site of said sample with said laser beam.

19. The apparatus according to claim 14, wherein said failure analyzer is configured to identify said defects in at least one of pn junctions, Schottky junctions, and metal interconnect lines.

20. An apparatus for analyzing a failure, comprising:

a laser beam generator configured to generate a laser beam of a predetermined wavelength;

a voltage applier configured to apply a variable voltage to a sample;

a current detector configured to detect a current generated in said sample as a result of the application of said variable voltage and irradiation with said laser beam; and a failure analyzer configured to analyze a failure in said sample, based on a variable-voltage current response curve detected in said current detector by changing said voltage while said sample is irradiated with said laser beam, by comparing said variable-voltage current response curve to a current response curve from a failure-free site of the sample to thereby analyze the causes of failures.

21. The apparatus according to claim 20, further comprising a laser beam controller having a first function of scanningly irradiating said sample with said laser beam, and a second function of fixedly irradiating a specific site of said sample with said laser beam.

22. The apparatus according to claim 21, wherein said specific site of said sample is a failure-containing region in which some form of failure occurs, said apparatus further comprising a laser beam interceptor configured to intermittently intercept said laser beam when said laser beam controller fixedly irradiates said failure-containing region with said laser beam.

23. The apparatus according to claim 21, wherein said current detector detects said current at a plurality of timed instants after irradiation of said failure-containing region with said laser beam, said plurality of timed instants being respectively corresponding to time constants of said current, said time constants being different from each other in excitation source of carriers generated by the irradiation with said laser beam.

24. The apparatus according to claim 20, wherein said failure analyzer is configured to identify said defects in at least one of pn junctions, Schottky junctions, and metal interconnect lines.

* * * * *